United States Patent [19]

Kuckes

[11] Patent Number: 5,305,212
[45] Date of Patent: Apr. 19, 1994

[54] ALTERNATING AND STATIC MAGNETIC FIELD GRADIENT MEASUREMENTS FOR DISTANCE AND DIRECTION DETERMINATION

[75] Inventor: Arthur F. Kuckes, Ithaca, N.Y.

[73] Assignee: Vector Magnetics, Inc., Ithaca, N.Y.

[21] Appl. No.: 868,859

[22] Filed: Apr. 16, 1992

[51] Int. Cl.$^5$ ............................................. G06F 15/20
[52] U.S. Cl. ..................................... 364/422; 324/346
[58] Field of Search .................. 364/422; 324/346; 175/40, 45; 166/66.5

[56] References Cited

U.S. PATENT DOCUMENTS

| | | |
|---|---|---|
| 3,317,821 | 5/1967 | Patton et al. . |
| 4,072,200 | 2/1978 | Morris et al. . |
| 4,293,815 | 10/1981 | West et al. ........................ 364/422 |
| 4,323,848 | 4/1982 | Kuckes . |
| 4,372,398 | 2/1983 | Kuckes . |
| 4,437,064 | 3/1984 | Overton, Jr. et al. . |
| 4,443,762 | 4/1984 | Kuckes . |
| 4,502,010 | 2/1985 | Kuckes . |
| 4,529,939 | 7/1985 | Kuckes . |
| 4,700,142 | 10/1987 | Kuckes . |
| 4,791,373 | 12/1988 | Kuckes . |
| 4,845,434 | 7/1989 | Kuckes et al. ..................... 324/346 |
| 4,901,023 | 2/1990 | Vail, III . |
| 4,933,640 | 6/1990 | Kuckes . |
| 5,064,006 | 11/1991 | Waters et al. . |
| 5,084,678 | 1/1992 | Hutin . |
| 5,218,301 | 6/1993 | Kuckes . |

OTHER PUBLICATIONS

"Successful ELREC Logging for Casing Proximity in an Offshore Louisiana Blowout", C. L. West et al. SPE 11996; 8 pages, 1983.

Primary Examiner—Robert A. Weinhardt
Attorney, Agent, or Firm—Jones, Tullar & Cooper

[57] ABSTRACT

Magnetic field gradient sensing apparatus utilizing highly sensitive fluxgate magnetometers permit direct determination of the distance between two well bores and for determining the direction from one bore to the other. The gradient sensing apparatus may be responsive to alternating magnetic fields resulting from current flow in a steel casing within a target well and measured by two fluxgate magnetometers diametrically oppositely located in a sensor tool and oriented to measure the vector components of the alternating field at opposite sides of the tool to thereby obtain a measure of the gradient of the field across the diameter of the tool. Field gradient sensing apparatus may also be used to measure the gradient of a static magnetic field having a radial gradient, wherein the static field is produced by ferromagnetic materials in the target well. Again, a pair of magnetometers is utilized to measure the field gradient across the diameter of the sensor to determine distance and direction to the target. Both static and alternating magnetic fields may be simultaneously measured for improved accuracy and reliability.

16 Claims, 3 Drawing Sheets

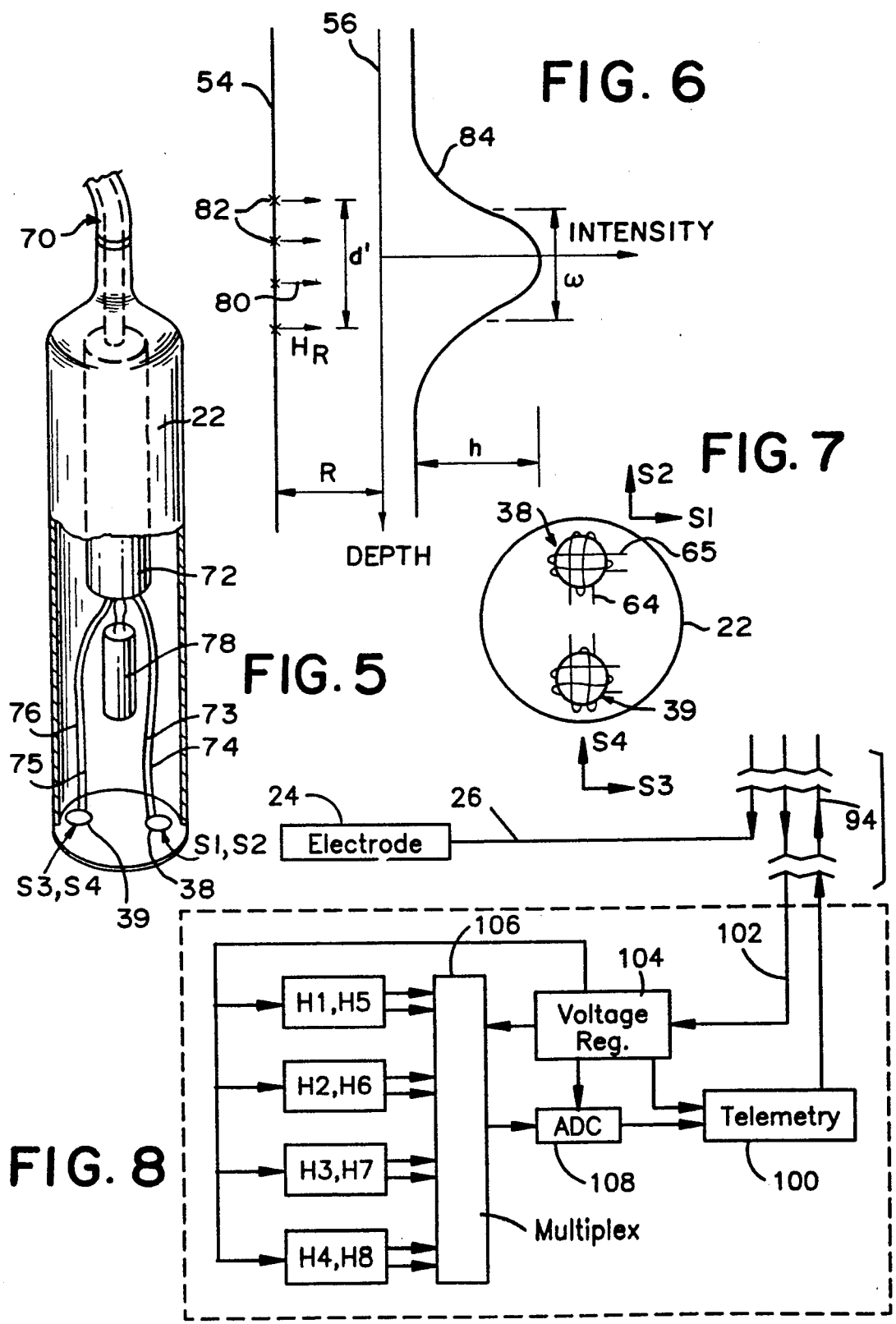

ALTERNATING AND STATIC MAGNETIC FIELD GRADIENT MEASUREMENTS FOR DISTANCE AND DIRECTION DETERMINATION

BACKGROUND OF THE INVENTION

The present invention is directed, in general, to an apparatus and a method of determining the distance between a relief well, or borehole, being drilled and an existing cased target well. More particularly, the invention is directed to a method for directly obtaining the distance between a relief borehole and a target well through the measurement of alternating or static magnetic field gradients, or both, at the location of the relief well. The invention further provides a method for determining the direction to the target well from the relief well.

Although electronic methods for guiding the drilling of a relief borehole to intersect an existing, or target, well having a casing have been extremely successful, it has recently become apparent that often some additional way to guide the final portion of the relief borehole after it is within a few feet of the target is needed. This need arises particularly when the total depth of the target well closely coincides with the desired intersection point, which often occurs, or if complications arise with mathematical modeling in a situation where modeling is required for determination of the current flow on the target. During the drilling of a relief well, particularly after it is within a few feet of the target, static Earth field perturbations can be very large due to the ferromagnetic nature of the casing of the target well. The magnetic poles which generate these perturbations are "smeared out" along the length of the target well to such an extent that the present methods of mathematical analysis of the associated field perturbations have been virtually useless, and this problem has led to documented cases of drastic error in directing the relief well.

SUMMARY OF THE INVENTION

In accordance with the present invention, a magnetic field gradient sensing apparatus is provided in a sensor tool to measure the field gradient across the diameter of a relief well. This magnetic field gradient permits a direct determination of the distance between the relief and target well bores either through the use of an alternating magnetic field system or through the use of a static magnetic field system, or a combination of the two.

More particularly, in accordance with the present invention, alternating current is caused to flow on a subterranean well casing, as by injecting electric current into the surrounding strata by means of an electrode in a relief well, generally in the manner described in U.S. Pat. No. 4,372,398, issued to the applicant herein. As there described, an electric current is injected into the earth from an electrode carried on a wire line in the relief well. The electrode contacts the earth and an AC source at the surface supplies low frequency current by way of the wireline to the electrode. Current flows from the electrode into the surrounding strata, with a portion of that current being collected by the electrically conductive casing within the borehole of the target well, thereby causing an alternating current to flow in the casing.

The current flow in the casing generates an alternating magnetic field which, in accordance with Amperes Law, encircles the conductive casing with the field strength of the magnetic field falling off inversely with distance away from the casing. This magnetic field can be detected in the relief well by means of a highly sensitive measuring device such as a fluxgate magnetometer. In accordance with the present invention, magnetic field sensing apparatus located in the relief well uses such magnetometers to measure the gradient of the alternating magnetic field across the diameter of the sensing apparatus in the relief well. This gradient provides a mathematically direct and simple determination of the distance between the center of the sensor in the relief well and the center of the target well.

As an alternative to the alternating magnetic field technique, the invention also provides a method for determining the distance to the target well from the sensor in the relief well from measurements of static magnetic field perturbations generated by the casing in the target well. In this case, the static magnetic field external to the target casing can be represented as a superposition of free space magnetic poles situated along the axis of the target well. The gradient in the radial direction, or the "fall off" of the static magnetic field strength is complex; however, measurement of this gradient at the location of the sensor can be used to determine the distance between the axis of the sensor and the axis of the nearby well casing.

BRIEF DESCRIPTION OF THE DRAWINGS

The foregoing, and additional objects, features and advantages of the present invention will become apparent to those of skill in the art from a consideration of the following detailed description of a preferred embodiment thereof, taken in conjunction with the accompanying drawings, in which:

FIG. 5 is a partially cut away enlarged view of the sensor tool of FIG. 1;

FIG. 6 is a graphical illustration of the measurement of the static magnetic field generated by ferromagnetic effects in a target well;

FIG. 7 is a diagrammatic illustration of the location of fluxgate magnetometers within the sensor of FIG. 5; and FIG. 8 is a block diagram of the downhole circuitry for the sensor of the present invention.

DESCRIPTION OF PREFERRED EMBODIMENTS

Figure 1:
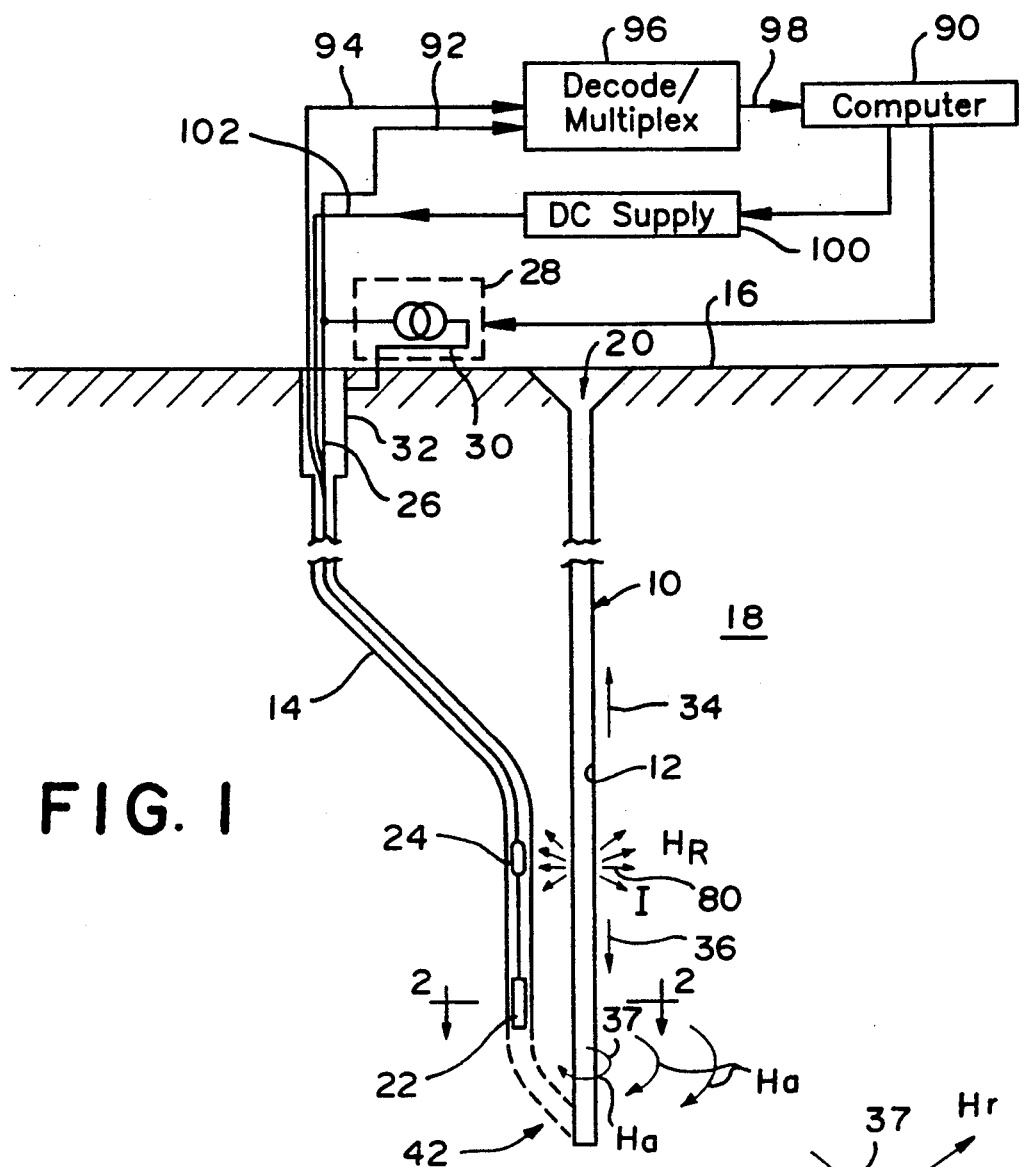
FIG. 1 is a diagrammatic illustration of the relationship between an existing target well to be located and a relief borehole being drilled to intersect the relief well at a predetermined depth below the surface of the earth.

Turning now to a more detailed description of the present invention, there is illustrated in FIG. 1 a target well 10 which may represent, for example, a gas well having a steel casing 12 which is to be intercepted by a relief well 14 at some arbitrary depth below the surface 16 of the earth 18. Although FIG. 1 illustrates the well 10 as being relatively straight, in reality such wells are more complex, since the direction a drill moves through the earth cannot be controlled precisely. Even a very small deviation in the direction of the drill can result in a significant change in the location of the borehole so that at a depth of 10,000 feet, for example, the target well can be anywhere within a circle having a diameter of 100 feet or more. The relief well 14 is subject to the same control problems, but in addition, it must be started at some distance from the wellhead 20 of target well 10, with the result that the borehole must be drilled at complex angles to cause it to travel straight down for a distance, then to curve toward an intersection with the target well at its assumed location and then, as it approaches the target well, to straighten and travel parallel to the target. Since the same drilling error exists for the relief well as existed for the original well, the exact location of the end of the relief well will also be unknown and also may be anywhere within a circle having a diameter of 100 feet or more.

For the initial drilling of the relief well 14, conventional surveying techniques provide a satisfactory guide to the drillers, but as the relief well approaches to within 150 or 200 feet of the target well, more accurate measurements are required. Accordingly, as the relief well is drilled, the drilling tool is periodically withdrawn from the borehole 14 and a magnetic field sensor tool 22 is lowered down the borehole 14 by means of conventional well logging equipment (not shown), in the manner described in U.S. Pat. No. 4,372,398. As described in that patent, the sensor tool includes a magnetometer which senses the magnetic field produced by current flowing in the steel casing 12 of the target well as a result of current injected into the earth 18 surrounding the wells. This injected current is provided by means of a suitable electrode 24 which is carried by the well logging cable, or wireline, and which is lowered into the borehole 14 with the sensor tool 22. Alternating current is supplied to the electrode 24 by means of a power cable 26 connected to an alternating current source 28 located at the earth's surface, the power cable being supported in the well by the logging cable. The AC power source may be grounded by way of cable 30 to a surface casing 32, for example, used with the relief well 14. This surface casing may extend 100 feet or more into the ground to provide a return electrode for current injected into the ground by electrode 24.

At least a part of the current flowing into the earth from electrode 24 is intercepted by the casing 12 in target well 10 to produce a current flow I upwardly from the level of the electrode 24, as illustrated by arrow 34, and downwardly from the level of the electrode 24 as indicated by arrow 36. This current generates a horizontally directed magnetic field H generally in a plane perpendicular to the axis of the casing 12 and circulating around the target well azimuthally in the manner illustrated by arrow 37. The magnetic field H is detected by magnetic field sensors in sensor tool 22.

Although the magnetometer described in U.S. Pat. No. 4,372,398 can measure the magnetic field 37 with a high degree of accuracy as the relief well 14 approaches the target well 10, when the relief borehole is within a few feet of the target well, additional means for guiding the borehole are often required, particularly when the total depth of the target well closely coincides with the desired intersection point, in the manner generally indicated at 42 in FIG. 1. Such an additional guidance apparatus is provided in the sensor tool of the present invention, illustrated in greater detail in FIG. 2, to which reference is now made.

As previously described with respect to FIG. 1, the steel casing 12 of target well 10 carries the alternating electric current I (amperes) which is flowing downwardly (into the plane of the Figure) at the level of the sensor 22. This current I generates an azimuthally directed magnetic field $H_a$ (amperes/meter), illustrated by arrows 37 in FIG. 2, around the well 10, with the magnetic field extending into the region of the relief well 14. At a distance R (meters) the alternating magnetic field strength $H_a$ is given approximately by the Amperes Law relation $I/(2\pi R)$. The sensor tool 22 in the embodiment of FIG. 2 incorporates a pair of two-component magnetometers 38 and 39 which produce outputs corresponding to magnetic field vector components in the directions S1, S2, S3 and S4. The sensors are symmetrically located around the periphery of the sensor 22 (i.e., are diametrically opposite each other) and lie in a plane perpendicular to the longitudinal (or vertical) axis of the sensor tool. These sensors 38 and 39 are located with their centers on a circle of radius a (meters) having its axis coaxial with that of the sensor tool. Each of these magnetometers measures the vector component of the magnetic field in the direction of the arrows S1, S2, S3 or S4 labeling that component. Thus, as illustrated by the directional arrows in FIG. 2, the magnetometers 38 and 39 on diametrically opposite sides of the sensor tool (or on diametrically opposite sides of the circle having a radius a) measure magnetic field vector components in the same direction. As illustrated, the diametrically opposite sensor coils S1 and S3 sense magnetic field components in the same lateral direction with respect to the diameter of the sensor, and diametrically opposite magnetometers S2 and S4 sense magnetic field vector components in the same diametric direction (for example, to the right as viewed in FIG. 2) and perpendicular to S1 and S3.

Figure 3:
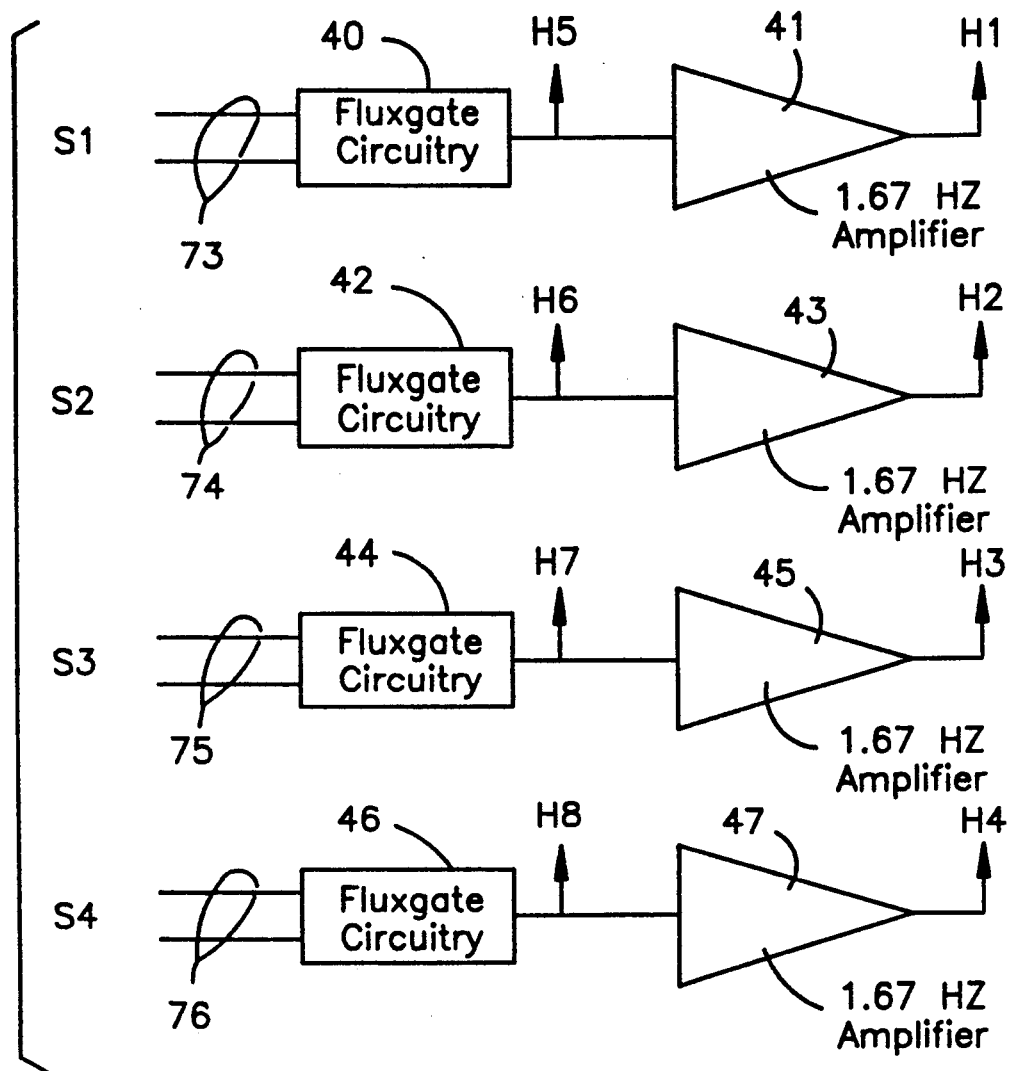
FIG. 3 shows the relationship between the fluxgate sensors, the downhole electronics connected to each sensor, and the magnetic field quantities measured.

Each of the sense coils S1, S2, S3, and S4 is connected to corresponding fluxgate circuitry and an amplifier as shown in FIG. 3. The fluxgate circuit 40 for sensor S1 produces an output voltage H5 which is proportional to the total magnetic field component in the S1 direction at the sensor 38, which component consists of the static field plus a very tiny part which is proportional to the alternating magnetic field present. The voltage H5 is taken to represent the static field component in the S1 direction at the sensor. A tuned amplifier 41 is connected to the output of the fluxgate circuit 40 and, with a gain of about 1000 produces the output H1 which is taken to be the alternating magnetic field in the S1 direction at the sensor. Similarly the S2 sensor or magnetometer 38 produces a static output H6 from fluxgate circuit 42 and an alternating output H2 from amplifier 43, sensor S3 on magnetometer 39 produces H7 from circuit 44 and H3 from amplifier 45, and sensor S4 on magnetometer 39 produces static output H8 from circuit 46 and alternating field output H4 from amplifier 47.

When the sensor tool is lowered into the relief borehole 14, the wireline, or logging cable, to which it is fastened may twist so that the azimuthal orientation of the sensor tool will have some arbitrary direction with respect to the direction from the relief borehole to the target well. The reference axis of the sensor tool may be a diameter passing through the centers of magnetometers 38 and 39, as indicated by reference axis 50. The angle between this reference axis and a line 52 connecting the axes 54 and 56 of the target and relief wells, respectively, is represented by the angle A. A is positive when 50 is clockwise from line 52. Assuming that the radius a is small compared to the radial distance R between the axis 54 of the target well and the axis 56 of the relief borehole, the alternating magnetic field components H1, H2, H3 and H4 can be combined and written to a first approximation using a Taylor series expansion of the field as follows:

$$H1 - H3 = \frac{-I}{2\pi R} \frac{2a}{R} \cos 2A \quad [1]$$

$$H2 - H4 = \frac{-I}{2\pi R} \frac{2a}{R} \sin 2A \quad [2]$$

$$H1 + H3 = \frac{2I}{2\pi R} \cos A \quad [3]$$

$$H2 + H4 = \frac{2I}{2\pi R} \sin A \quad [4]$$

These signals can be combined to produce the direction and distance to the target well from the relief well, as follows:

$$\frac{I}{2\pi R} = \frac{\sqrt{(H1 + H3)^2 + (H2 + H4)^2}}{2} \quad [5]$$

$$R = a \sqrt{\frac{(H1 + H3)^2 + (H2 + H4)^2}{(H1 - H3)^2 + (H2 - H4)^2}} \quad [6]$$

$$A = \arctan 4((H2 + H4), (H1 + H3)) \quad [7]$$

wherein R is the radial distance between the centers of the wells, and A is the angle described above, and where arctan4 is the four quadrant arc tangent function.

Although equation [6] provides a good determination of the distance R from a set of measurements at a single depth, it is often possible to apply signal averaging to an ensemble of sets of measurements in a way which increases the range and precision of the method and suppresses systematic imbalances between the sensors. In hoisting and lowering a borehole logging tool it usually rotates, when this occurs it may be possible to repeatedly reoccupy a depth of interest or to make measurements at a number of nearby locations with different tool orientations. From this ensemble of measurement sets a part which varies as cos 2A or as sin 2A can be identified, using well known least squares methods of data fitting. In particular if we have an ensemble of n sets of measurements at a given station, each identified by the subscript i, then by forming the quantities $$A_i = \arctan 4((H1_i + H3_i), H2_i + H4_i) \quad [8]$$

$$P_i = \frac{(H1_i - H3_i)}{\sqrt{(H1_i + H3_i)^2 + (H2_i + H4_i)^2}} \quad [9]$$

$$Q_i = \frac{(H2_i - H4_i)}{\sqrt{(H1_i + H3_i)^2 + (H2_i + H4_i)^2}} \quad [10]$$

A best fit to the distance R between the target well and the relief well is given by either of the two expressions $$R = -\frac{a \sum_1^n \cos^2 2A_i}{\sum_1^n P_i \cos 2A_i} \quad [11]$$

$$R = -\frac{a \sum_1^n \sin^2 2A_i}{\sum_1^n Q_i \sin 2A_i} \quad [12]$$

The tool orientation in space, and thus the compass direction of axis 50, is determined by well known orientation apparatus such as inclinometers and compasses, and when the direction of line 50 has been determined, the compass direction from the relief well axis to the axis of the target well is determined from the value of angle A.

Figure 2:
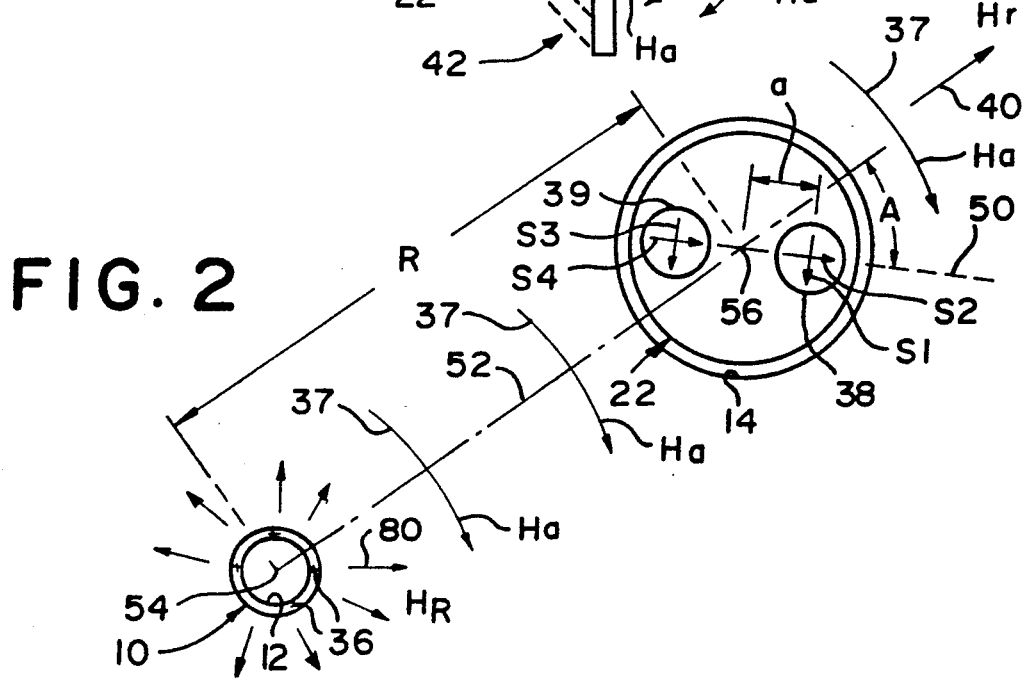
FIG. 2 is a diagrammatic top plan view of the target well and the relief borehole at cross sectional line 2—2 of FIG. 1, showing the relationship between the target well and the relief borehole at the location of the magnetic field sensors.
Figure 4:
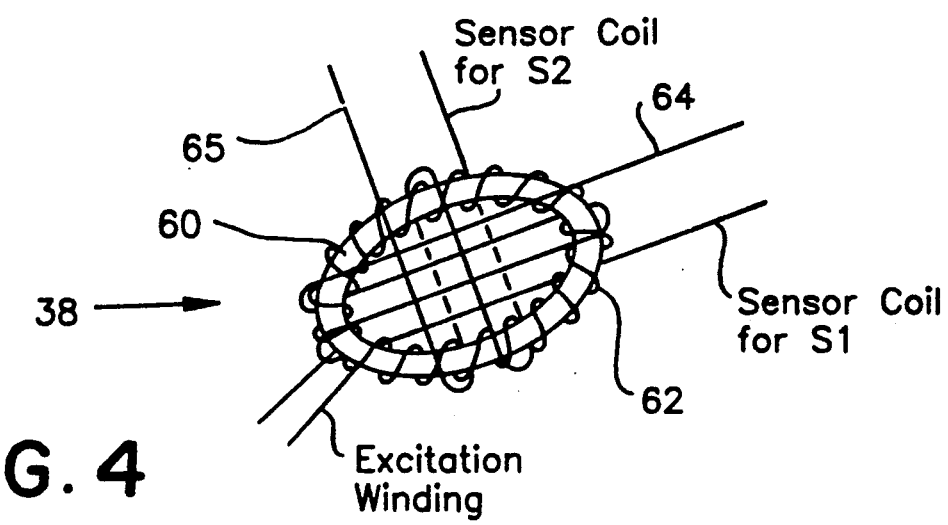
FIG. 4 illustrates in diagrammatic form a fluxgate magnetometer suitable for use in the sensor of FIG. 2.

The fluxgate magnetometers used in the sensor tool of FIG. 2 are illustrated diagrammatically by magnetometer 38 in FIG. 4, and may include a ferromagnetic ring core 60 carrying a torroidal excitation winding 62. The ring core also carries first and second sensor coils 64 and 65 which are wound around the outside of core 60 and which have their axes perpendicular to each other. These axes lie in the plane of the core and thus are perpendicular to the axis of the core. Each magnetometer is oriented within the sensor tool so that the axes of sensitivity of its sensor coils are in the directions indicated by the arrows labeling the respective magnetometers in FIG. 2.

FIG. 5 is a diagrammatic illustration of a sensor tool 22 carrying the sensors 38 and 39 described above with respect to FIG. 2. The sensor tool is lowered into a borehole after removal of the drilling assembly, in the manner, described with respect to FIG. 1, the sensor being lowered on a standard seven conductor open hole logging cable 70. The cable 70 carries the electrode 24, as discussed above, which is located at about 300 feet above the sensor tool and which emits a few amperes of alternating current at a frequency of, for example, 1.67 Hertz under the control of the surface power supply unit 28. The sensor tool 22 has an overall length, in one embodiment, of about 8 feet and a diameter of 5.5 inches. The two ring core fluxgate magnetometers are mounted in the sensor in the manner described with respect to FIG. 2, and in this embodiment, the centers of the ring cores are 2.25 inches (dimension "a") from the center axis 56 of the center tool. Each ring core (core 60 in FIG. 4) has a diameter of ⅝ of an inch in the preferred form of the invention. The ring cores are mounted in the bottom of the sensor tool and are oriented in the manner described above with respect to FIG. 2.

The control circuitry, including circuits 40–47 for the magnetometers is mounted above the cores in the sensor tool within a protective housing 72, with the various windings carried by the magnetometers being connected to this circuit by corresponding cables 73, 74, 75 and 76. In addition to the magnetometers, the sensor tool 22 incorporates two inclinometers within a housing 78, the inclinometers being responsive to the inclination of the tool in perpendicular directions with respect to a horizonal X-Y plane. The output signals from these inclinometers together with signals H5, H6, H7 and H8 representing measurements of the static magnetic field and independent borehole survey data e.g. a gyro survey are used to determine the orientation of the logging tool in space, utilizing conventional downhole well surveying techniques. These measurements determine the direction of the reference axis 50 of the sensor with respect to the earth's magnetic field and after determination of angle A, permit a determination of the compass direction from the relief well to the target well.

The static magnetic field sensors may also be used to determine the direction and distance of the target well from the relief well through the measurement of the static field 80 generated by ferromagnetic effects in the target. These magnetic effects are due, for example, to the presence of the steel casing 12 or other magnetic materials within the well 10. Such ferromagnetic material can usually be represented mathematically by a superposition of magnetic poles 82 situated along the axis 54 of the target well, as illustrated in FIG. 6, with each pole generating a radial magnetic field $H_R$ which falls off inversely with the square of the distance from the axis of the target well 10. For the case when the distance R between the axis of borehole 14 and the axis of target well 10 is less than a few feet, the effective magnetic pole of the target is usually spread out along the axis of the target well, over an axial distance d somewhat greater than the distance between the wells. Within a few feet, the composite radial field 80 of all the superposed point sources falls off inversely with radial distance away from axis 54. Beyond a radial distance R of 5 or 6 feet, however, the field falls off at a rate closer to the inverse square of the distance. The effective power law which describes the fall off of the magnetic field with distance within 5 or 6 feet can be determined by measuring the fields and field gradients as a function of depth in the relief borehole. The effective power law may be represented as n, so that the radial component of the field decreases with the inverse nth power of the radius at the depth of measurement.

Since voltage outputs H5 through H8 measure the total static magnetic field, it is necessary to compensate these measurements for the value of the earth's magnetic field to obtain the static field $H_R$ produced by the target. Accordingly, measurements are made in the borehole where the earth's field is undisturbed to obtain the direction and magnitude of the earth's magnetic field and thus the vector components of the Earth's field corresponding to the orientation of the sensor windings which produce output signals S1 through S4. These unperturbed earth's magnetic field values can be found from observations in the borehole or by computation. The quantities H5' through H8' representing components of the perturbation field vector components produced by the ferromagnetic material in the target well at the sensor locations in the new borehole are found by subtracting the unperturbed Earth's field components from the measurements H5 through H8. As indicated above, the perturbation field 80 is radial with respect to the target well, is independent of azimuth, and decreases inversely with the nth power of the radial distance; that is, $$H_r = H_0 \left(\frac{R_0}{R}\right)^n \quad [13]$$

where $H_O$ is the magnetic field strength at the target casing radius $R_O$.

The perturbation signals H5' through H8' derived from each of the magnetometer sensors can be related to a first approximation using a Taylor series expansion of the field H, assuming the tool radius a is a good deal less than the distance R to the target by the following:

$$H5' - H7' = H_0 \left(\frac{R_0}{R}\right)^n \left(\frac{(n+1)a}{R}\right) \sin 2A \quad [14]$$

$$H6' - H8' = -H_0 \left(\frac{R_0}{R}\right)^n \left(\frac{(n+1)a}{R}\right) \cos 2A \quad [15]$$

$$H5' + H7' = -H_0 \left(\frac{R_0}{R}\right)^n 2 \sin A \quad [16]$$

$$H6' + H8' = H_0 \left(\frac{R_0}{R}\right)^n 2 \cos A \quad [17]$$

If the perturbation field has an n value significantly different from n=1 these equations refer to a depth of measurement opposite the center of the magnetic anomaly on the target well.

The signals H5' through H8' may be further combined to form the following equations which provide the distance R from the relief well to the target and the angle A between the azimuthal orientation of the sensor represented by line 50 and the line 52 extending between the axes of the two wells:

$$R = \frac{(n+1)a}{2} \sqrt{\frac{(H5' + H7')^2 + (H6' + H8')^2}{(H5' - H7')^2 + (H6' - H8')^2}} \quad [18]$$

$$A = \arctan 4((H6' + H8'), (H5' + H7')) \quad [19]$$

Thus, if the effective fall off rate n of the radial field is known, the distance R can be determined directly from the magnetic field component measurements. This effective fall off rate can be found by noting the ratio between a value R' (assuming n=1) given by equation 18 and the depth variation of the total perturbation of the radial field. The variation of the radial field with depth is measured by moving the sensor 22 to various locations along the relief well 14 and measuring the magnetic field values at each step. FIG. 6 provides a graphical illustration of this variation in the perturbation at curve 84, which has a bell shape as a function of depth with a characteristic full width w at half height (h/2). If R' is considerably less than the depth interval of this width w, then n is equal to one. This is usually the case when the relief well is within a few feet of the target well. However, if this is not the case, then the effective value for n is readily found by mathematically modeling the detailed shape of the depth variation curve 84 of the perturbation fields together with the values of R' found by the formula of equation [18].

Equation [18] provides a good determination of the radial distance R from a set of measurements at a single depth. As with the azimuthal fields generated by currents represented by the quantities H1 through H4, the radial fields H5' through H8' can be subject to similar subject averaging. In this case the following quantities are formed:

$$S_i = \frac{H5'_i - H7'_i}{\sqrt{(H5'_i + H7'_i)^2 + (H6'_i + H8'_i)^2}} \quad [20]$$

-continued $$T_i = \frac{H6'_i - H8'_i}{\sqrt{(H5'_i + H7'_i)^2 + (H6'_i + H8'_i)^2}} \quad [21]$$

$$A_i = \arctan 4((H6'_i + H8'_i), (H5'_i + H7'_i)) \quad [22]$$

The best fit to the distance R between the target well and the relief well is given by either of the two expressions:

$$R = -\frac{(n+1)a \sum_1^n \cos^2 2A_i}{\sum_1^n T_i \cos 2A_i} \quad [23]$$

$$R = -\frac{(n+1)a \sum_1^n \sin^2 2A_i}{\sum_1^n S_i \sin 2A_i} \quad [24]$$

As noted above, in a preferred form of the invention, the ring core fluxgate magnetometer 38 illustrated in FIG. 4 includes two sensor coils 64 and 65, both of which are wound around the exterior of ring core 60 and around excitation winding 62. Thus, as illustrated in FIG. 7, sensor 22 incorporates two substantially identical ring core fluxgate magnetometers 38 and 39, each carrying two perpendicular sensor windings so that each magnetometer is responsive to the magnetic field component in the radial direction and in the azimuthal direction of the sensor, as indicated by the arrows S1 through S4 in FIG. 2. Thus, sensor 38 includes a first sensor winding 64 for measuring the azimuthal magnetic field in the direction of arrow S1 and carries a second magnetic field sensor winding 65 wound with its axis perpendicular to the axis of winding 64 and arranged to measure the radial component of the field in the direction indicated by arrow S2. In similar manner, magnetometer 39 includes sensor windings oriented for measurement of azimuthal and radial magnetic field vector components in the same directions as the corresponding windings of magnetometer 38.

A block diagram of the electronic circuitry is illustrated in FIGS. 1, 3 and 8, FIG. 1 illustrating the surface equipment and FIGS. 3 and 8 illustrating the downhole equipment. The system is controlled at the surface by a suitable computer 90 which may be a PC 386 laptop computer or equivalent. The frequency of the electrode power supply 28 is crystal controlled and the instantaneous current supplied to the electrode 24 is digitally multiplexed with the data received from the downhole sensor tool 22 by way of lines 92 and 94 and a decoder/multiplexer 96 which supplies this information back to the computer by way of line 98. The computer also controls the voltage provided by DC supply circuit 100, the output of which is fed by way of line 102 to the downhole electronics, and more particularly to a voltage regulator 104 (FIG. 8) which, in turn, supplies power to the downhole electronic circuitry.

As illustrated in FIGS. 3 and 8, the outputs from the magnetometers 38 and 39 are supplied by way of their corresponding cables 73-76 through corresponding fluxgate and amplifier circuits 40-47 to a multiplexer 106 and through an analog to digital converter 108 to suitable telemetry equipment 110 for transmitting the data received from the magnetometers uphole by way of cable 94 to the computer 90. The data measured by the magnetometers is thus transmitted to the computer which processes this data in accordance with the equations described above to produce the distance and directional measurements from the relief well to the target well for use in controlling further drilling of the relief borehole.

In operation, after withdrawing the drill stem from the relief borehole 14, the sensor 22 is lowered to the bottom of the borehole and measurements are begun. The sensor tool is held stationary at each of a number of depth locations where measurements are made because even the slightest movement of the sensor tool in the earth's magnetic field causes very large time-varying voltages in the instrument. This is due to the fact that the alternating magnetic fields being measured are of very low magnitude, typically one thousand to one hundred thousand times less than the earth's magnetic field. Measurements are made at stations a few feet apart vertically along the relief borehole near the bottom of that borehole. After obtaining a large number of measurements, the sensor tool 22 is withdrawn and the data processed following the procedures outlined above. Drilling may then be resumed, utilizing the calculated information concerning the distance and direction to the target well. Although measurements of either the static magnetic field or the alternating magnetic field may be used to determine distance and direction to the target well, it is preferred that both measurements be made simultaneously utilizing the magnetometer of FIG. 5 arranged in the manner illustrated in FIG. 7 so as to obtain the maximum amount of information and the highest degree of reliability in the shortest possible time.

These measurements are, in effect, measurements of the gradient of the magnetic field across the diameter of the sensor tool, windings S1 and S3 effectively measuring the gradient of the azimuthal field component perpendicular to the diameter connecting the sensors. Windings S2 and S4 measure the gradient of the field component parallel to the diameter connecting the sensors (as viewed in FIG. 2). The vector produced by (H1-H3) and (H2-H4) represents the gradient of the alternating current-generated azimuthal field across the diameter of the tool (or more accurately across the diameter of the circle having the radius a within the tool). The vector outputs (H5-H7) or (H5'-H7') and the outputs (H6-H8) or (H6'-H8') are a measure of the gradient of the radial static magnetic field across the diameter of the tool (or more accurately across the diameter of the circle having the radius a on which the centers of the magnetometers lie). The gradients of the static and alternating magnetic fields follow known mathematical relationships with respect to the distance from the target well source of the respective magnetic fields so that the distance R can be accurately determined. Similarly, since it is known that the static field is radial with respect to the target well and the alternating field is azimuthal (or concentric) the relative orientation of the sensor tool with respect to the line 52 between the wells, and thus the value of angle A can be determined. By orienting the sensor tool 22 with respect to the earth's magnetic field, the compass direction of the line 50, and thus the compass direction of the line 52 can be determined and the direction of drilling the relief well can be provided.

Although the present invention has been described in terms of preferred embodiments, it will be understood by those of skill in the art that modifications and variations may be made without departing from the true spirit and scope thereof as set forth in the following claims:

What is claimed is:

1. Apparatus for determining the distance and direction of a first well with respect to a second nearby well, comprising:
   a sensor tool located in a first well, said sensor tool having an axis extending along the length of said first well;
   means producing at least one static magnetic field having its origin at said second well and extending radially from said second well at least to said first well;
   sensor means comprising two ring core fluxgate magnetometers located at diametrically opposite sides of said sensor tool, said magnetometers measuring corresponding magnetic field vectors of said at least one magnetic field for measuring a field gradient of said magnetic field perpendicular to said sensor tool axis; and
   means for determining the orientation of said sensor tool with respect to said magnetic field, the measured gradient of said field corresponding to the distance between said first and second wells and said determined orientation of said sensor corresponding to the direction to said second well from said first well.

2. The apparatus of claim 1, wherein each of said magnetometers includes a sensor winding having an axis of sensitivity, said magnetometers being located so that the axes of sensitivity of said sensor windings extend radially with respect to said sensor tool, diametrically opposite magnetometers measuring magnetic field vectors in the same direction.

3. The apparatus of claim 1, wherein said means producing at least one magnetic field further comprises means producing an alternating magnetic field extending in an azimuthal direction around said second well and extending into the region of said first well.

4. The apparatus of claim 3, wherein each of said magnetometers is located to detect a vector component of said static magnetic field and a vector component of said alternating magnetic field.

5. The apparatus of claim 4, wherein each of said magnetometers includes first and second sensor windings each having an axis of sensitivity, the axes of sensitivity of said first windings extending azimuthally and in the same direction with respect to said sensor tool and the axes of sensitivity of said second windings extending radially and in the same direction with respect to said sensor tool, said axes of sensitivity in each magnetometer being mutually perpendicular and lying in a plane perpendicular to the axis of said sensor tool.

6. The apparatus of claim 5, further including circuit means responsive to output signals from each of said sensor windings for determining the distance from said second well to said first well.

7. A method for determining the distance from a first well to a second, nearby well, comprising:
   producing a static magnetic field having its origin at said second well and extending radially with respect to said second well at least to said first well;
   locating a first plurality of sensor coils within a sensor located in said first well;
   measuring the field vectors of said produced magnetic field within a horizontal plane through said sensor located in said first well;
   determining from said field vectors the horizontal magnetic field gradient within said sensor; and
   determining from said field gradient the distance to said second well.

8. The method of claim 7, wherein the step of producing a magnetic field further includes producing an alternating magnetic field extending azimuthally with respect to said second well, and wherein the step of measuring further includes locating a second plurality of sensor coils within said sensor and measuring corresponding field vectors of said alternating magnetic field in said second plurality of sensor coils.

9. The method of claim 8, wherein the step of measuring said static and said alternating magnetic fields include locating a pair of fluxgate magnetometers at diametrically opposed locations within said first well, each of said magnetometers incorporating corresponding first and second sensor coils, said sensor coils on each magnetometer being mutually perpendicular and producing output signals corresponding to magnetic field vector components of said static and alternating magnetic fields.

10. The method of claim 7, wherein the step of determining the distance to said second well comprises combining said field vector output signals from said sensor coils in accordance with the following relationship:

$$R = \frac{(n+1)a}{2} \sqrt{\frac{(H5' + H7')^2 + (H6' + H8')^2}{(H5' - H7')^2 + (H6' - H8')^2}}$$

where
   R is the radial distance between the centers of said first and second wells;
   n is the effective power law for the radial fall off of the static magnetic field at the depth of measurement;
   a is the radius of a circle common to the sensors; and
   H5', H6', H7' and H8' are the respective static field vector output signals from the sensor coils, with the Earth's field components removed, of two spaced-apart magnetometers in said sensor.

11. The method of claim 7, further including determining the direction from said first well to said second well by the steps of:
   determining the orientation of said sensor to thereby locate the direction of a reference axis of said sensor; and
   determining the angle A between said reference axis and a radial line extending from the axis of the first well to the axis of the second well in accordance with the following relationship:

$$A = arctan\ 4\ ((H6' + H8'), (H5' + H7'))$$

where H5', H6', H7' and H8' are the respective static field vector output signals from the sensor coils with the Earth's field components removed from said plurality of sensor coils within said sensor.

12. The method of claim 7, wherein the step of measuring further includes producing static magnetic field vector output signals repetitively from a plurality of sensor positions within said first well to provide an ensemble of n sets of measurements having the following relationships:

$$S_i = \frac{H5'_i - H7'_i}{\sqrt{(H5'_i + H7'_i)^2 + (H6'_i + H8'_i)^2}}$$

-continued
$$T_i = \frac{H6'_i - H8'_i}{\sqrt{(H5'_i + H7'_i)^2 + (H6'_i + H8'_i)^2}}$$

$$A_i = \arctan 4((H6'_i + H8'_i), (H5'_i + H7'_i))$$

wherein the subscript i denotes an averaged value over a plurality of measurements, and wherein
  A is the angle between the reference axis of the sensor and a line between the axes of said first and second wells,
  S and T represent relationships of the vector output signals, and
  $H5'$, $H6'$, $H7'$ and $H8'$ are the respective static field vector output signals from the sensors with the Earth's field components removed;
  and wherein the distance R between the first and second wells is determined by either of the following relationships:

$$R = -\frac{(n+1)a \sum_1^n \cos^2 2A_i}{\sum_1^n T_i \cos 2A_i}$$

$$R = -\frac{(n+1)a \sum_1^n \sin^2 2A_i}{\sum_1^n S_i \sin 2A_i}$$

13. The method of claim 7, wherein the step of producing a magnetic field further includes producing an alternating magnetic field extending azimuthally with respect to said second well, and wherein the step of measuring includes locating a plurality of sensor coils within said sensor and producing from said coils field vector output signals corresponding to the gradient of said alternating magnetic field across the diameter of said sensor.

14. The method of claim 13, wherein the step of determining the distance to said second well comprises combining said field vector output signals from said sensor coils in accordance with the following relationship:

$$R = a \sqrt{\frac{(H1 + H3)^2 + (H2 + H4)^2}{(H1 - H3)^2 + (H2 - H4)^2}}$$

where
  R is the radial distance between the centers of said first and second wells;
  a is the radius of a circle common to said sensors; and
  H1, H2, H3 and H4 are the respective alternating magnetic field vector output signals from the sensor coils of two spacedapart magnetometers in said sensor.

15. The method of claim 13, further including determining the direction from said first well to said second well by the steps of:
  determining the orientation of said sensor to thereby locate the direction of a reference axis of said sensor; and
  determining the angle A between said reference axis and a radial line extending from the axis of the first well to the axis of the second well in accordance with the following relationship:

$$A = \arctan 4((H2+H4), H1+H3))$$

where H1, H2, h3 and H4 are the respective alternating field vector output signals from said plurality of sensor coils within said sensor.

16. The method of claim 13, wherein the step of measuring further includes producing alternating magnetic field vector output signals repetitively from a plurality of sensor positions within said first well to provide an ensemble of n sets of measurements having the following relationships:

$$A_i = \arctan 4((H1_i + H3_i), H2_i + H4_i)$$

$$P_i = \frac{(H1_i - H3_i)}{\sqrt{(H1_i + H3_i)^2 + (H2_i + H4_i)^2}}$$

$$Q_i = \frac{(H2_i - H4_i)}{\sqrt{(H1_i + H3_i)^2 + (H2_i + H4_i)^2}}$$

wherein the subscript i denotes an averaged value over a plurality of measurements, and wherein
  A is the angle between the reference axis of the sensor and a line between the axes of said first and second wells,
  H1, H2, H3 and H4 are the respective alternating magnetic field vector output signals from said sensor coils, and
  P and Q represent relationships of the vector output signals;
  and wherein the distance R between said first and second wells is determined by the least squares method of data fitting, using either of the following relationships:

$$R = -\frac{a \sum_1^n \cos^2 2A_i}{\sum_1^n P_i \cos 2A_i}$$

$$R = -\frac{a \sum_1^n \sin^2 2A_i}{\sum_1^n Q_i \sin 2A_i}.$$

* * * * *